US008624365B1

(12) United States Patent
Weiser

(10) Patent No.: US 8,624,365 B1
(45) Date of Patent: Jan. 7, 2014

(54) INTERPOSER BASED CAPACITORS FOR SEMICONDUCTOR PACKAGING

(75) Inventor: William B. Weiser, Meridian, ID (US)

(73) Assignee: Marvell International Ltd., Hamilton (BM)

( * ) Notice: Subject to any disclaimer, the term of this patent is extended or adjusted under 35 U.S.C. 154(b) by 159 days.

(21) Appl. No.: 13/182,869

(22) Filed: Jul. 14, 2011

Related U.S. Application Data

(60) Provisional application No. 61/367,209, filed on Jul. 23, 2010.

(51) Int. Cl.
*H01L 23/495* (2006.01)
(52) U.S. Cl.
USPC .................................. 257/668; 257/E23.06
(58) Field of Classification Search
USPC .................................. 257/668, 676; 438/111
See application file for complete search history.

(56) References Cited

U.S. PATENT DOCUMENTS

| 5,283,717 | A * | 2/1994 | Hundt | 361/813 |
|---|---|---|---|---|
| 5,909,350 | A * | 6/1999 | Anthony | 361/118 |
| 6,970,362 | B1 * | 11/2005 | Chakravorty | 361/782 |
| 7,732,929 | B2 * | 6/2010 | Otremba et al. | 257/777 |
| 2009/0140400 | A1 * | 6/2009 | Amey et al. | 257/664 |

* cited by examiner

*Primary Examiner* — William D Coleman

(57) ABSTRACT

Some of the embodiments of the present disclosure provide a semiconductor package structure comprising a leadframe; an interposer disposed on the leadframe, the interposer comprising a plurality of dielectric layers including at least (i) a first dielectric layer and (ii) a second dielectric layer; a semiconductor device disposed on the interposer; and a capacitor that is embedded within the interposer, wherein the capacitor is formed using at least (i) a first conductive area disposed on the first dielectric layer and (ii) a second conductive area disposed on the second dielectric layer. Other embodiments are also described and claimed.

18 Claims, 5 Drawing Sheets

INTERPOSER BASED CAPACITORS FOR SEMICONDUCTOR PACKAGING

CROSS REFERENCE TO RELATED APPLICATIONS

The present disclosure claims priority to U.S. Patent Application No. 61/367,209, filed Jul. 23, 2010, the entire specification of which is hereby incorporated by reference in its entirety for all purposes, except for those sections, if any, that are inconsistent with this specification.

TECHNICAL FIELD

Embodiments of the present disclosure relate to semiconductor packaging, and more specifically, to providing interposer based capacitors for semiconductor packaging.

BACKGROUND

Unless otherwise indicated herein, the approaches described in this section are not prior art to the claims in the present disclosure and are not admitted to be prior art by inclusion in this section.

In the current state of integrated circuit technology, an integrated circuit device is often in the form of a chip or a die. Such a chip is typically mounted onto an underlying substrate such as, for example, a carrier substrate to form a semiconductor package. Some semiconductor packages generally include one or more chips coupled to a substrate such as, for example, a leadframe. An interposer is generally used for bonding more than one chip on a single leadframe.

In various application areas, one or more capacitors are generally coupled to a chip that is mounted on the lead frame. For example, a decoupling capacitor is used to decouple a power connection and a ground connection of the chip, to reduce a power to ground noise level. Generally, for a chip mounted on a leadframe, such a capacitor is located on a printed circuit board (PCB) on which the lead frame is mounted. A placement of the capacitor on the PCB results in a relatively large distance between the chip and the capacitor. However, a relatively short distance between the chip and the capacitor is desired, for example, to increase an effectiveness of the capacitor and to decrease an inductance between the power and ground connections.

SUMMARY

In various embodiments, the present disclosure provides a semiconductor package structure comprising a leadframe; an interposer disposed on the leadframe, the interposer comprising a plurality of dielectric layers including at least (i) a first dielectric layer and (ii) a second dielectric layer; a semiconductor device disposed on the interposer; and a capacitor that is embedded within the interposer, wherein the capacitor is formed using at least (i) a first conductive area disposed on the first dielectric layer and (ii) a second conductive area disposed on the second dielectric layer. There is also provided a method comprising providing a lead frame; forming an interposer on the leadframe, wherein the interposer comprises a plurality of dielectric layers including at least (i) a first dielectric layer and a (ii) second dielectric layer; and disposing a semiconductor device on the interposer, wherein forming the interposer further comprises embedding a capacitor within the interposer using at least (i) a first conductive area disposed on the first dielectric layer and (ii) a second conductive area disposed on the second dielectric layer. There is also provided a semiconductor package structure comprising an interposer; a semiconductor device disposed on the interposer; a first capacitor that is embedded within the interposer; and a second capacitor that is embedded within the interposer.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
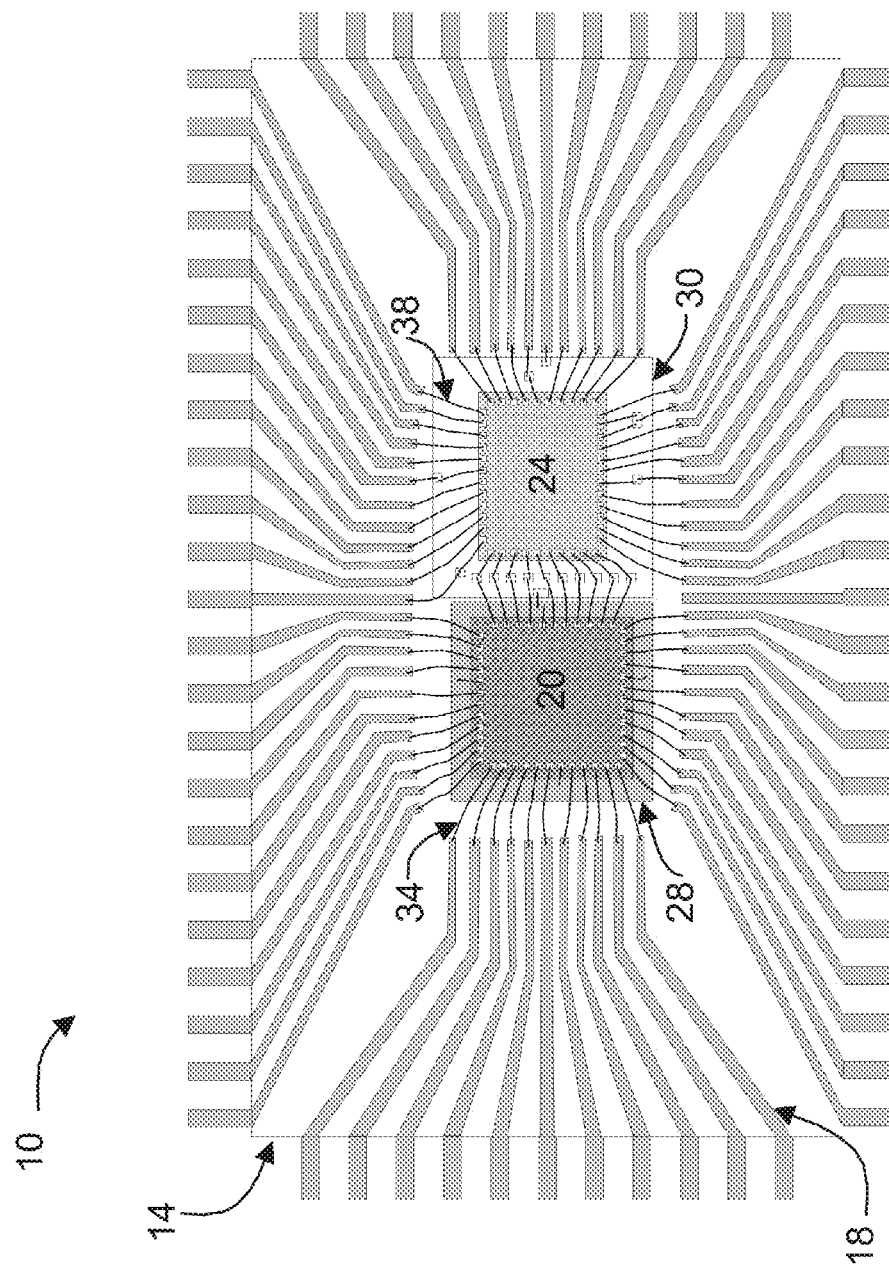
FIG. 1 schematically illustrates a semiconductor package structure, in accordance with an embodiment of the present disclosure.

FIG. 1 schematically illustrates a semiconductor package structure 10 (also referred to herein as structure 10), in accordance with an embodiment of the present disclosure. In various embodiments, the structure 10 includes a leadframe 14. Although not illustrated in FIG. 1, the leadframe 14 may be mounted on, for example, a PCB. The leadframe 14 can be formed from any one or more of various materials, depending on the application. As an example, leadframe 14 comprises copper or a copper alloy. The leadframe 14 comprises a plurality of bonding fingers 18.

A semiconductor device 20 and a semiconductor device 24 (also referred to herein as device 20 and device 24, respectively) are mounted on the leadframe 14. In various embodiments, the device 20 is mounted on the leadframe 14 through a die paddle 28, and the device 24 is mounted on the leadframe 14 through an interposer 30. As illustrated in FIG. 1, the interposer 30 is disposed on the leadframe 14, and the device 24 is disposed on the interposer 30.

Although not labeled in FIG. 1 for purposes of illustrative clarity, the devices 20 and 24 include a plurality of bond pads. One or more bond pads of the device 20 are electrically interconnected (e.g., using connectors 34) to corresponding one or more of the bonding fingers 18, for forming pin-out of the structure 10. Similarly, one or more bond pads of the device 24 are electrically interconnected (e.g., using connectors 38) to corresponding one or more of the bonding fingers 18 (e.g., via the interposer 30), for forming pin-out of the structure 10. Furthermore, one or more bond pads of the device 24 are electrically interconnected (e.g., via the interposer 30) to corresponding one or more bond pads of the device 20, as illustrate in FIG. 1.

Figure 2:
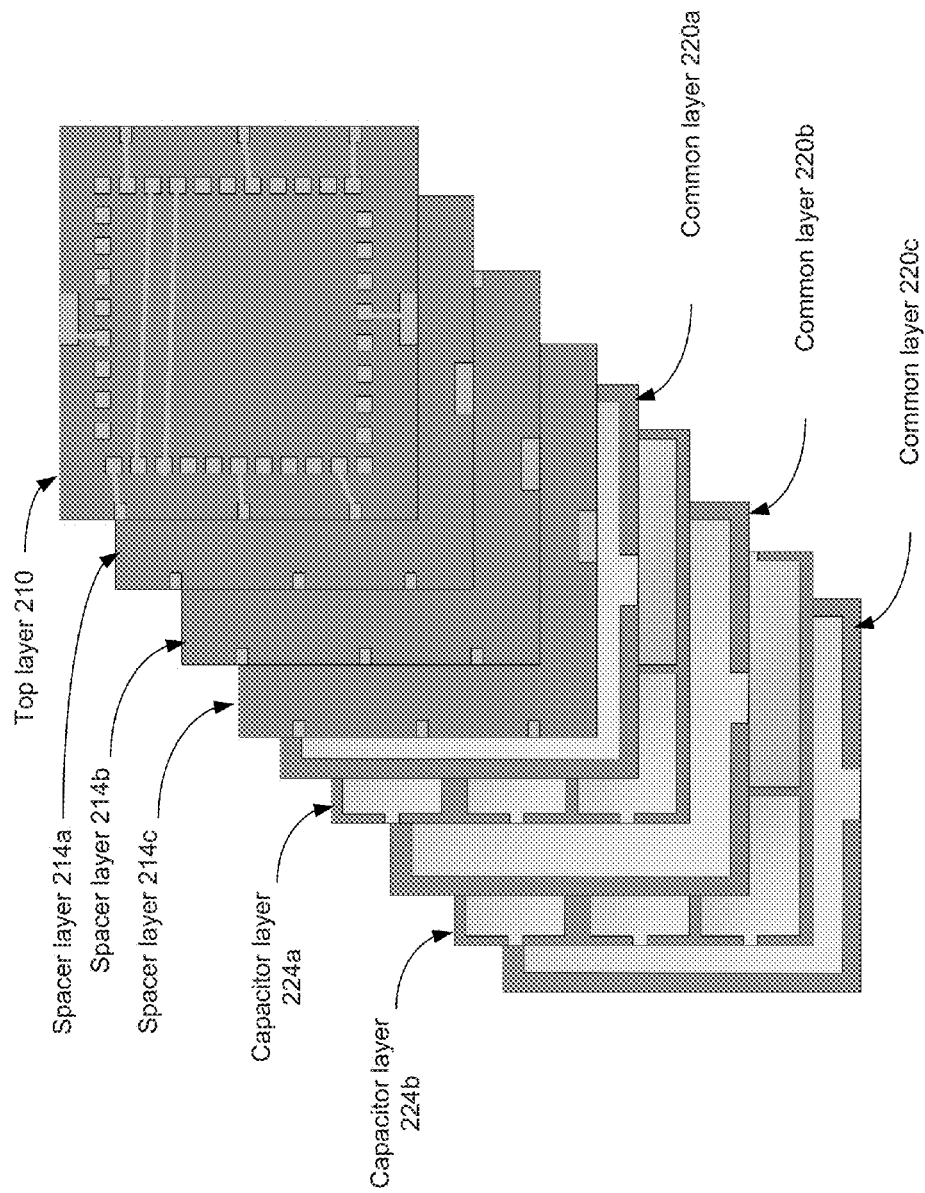
FIG. 2 schematically illustrates a plurality of dielectric layers of an interposer included in the semiconductor package structure of FIG. 1, in accordance with an embodiment of the present disclosure.

In various embodiments, the interposer 30 comprises a plurality of dielectric layers that are made of, for example, glass, ceramic or any appropriate dielectric material. FIG. 2 schematically illustrates the plurality of dielectric layers of the interposer 30, in accordance with an embodiment of the present disclosure.

As illustrated in FIG. 2, the interposer 30 includes a top layer 210, a plurality of spacer layers 214a, . . . , 214c, a plurality of common layers 220a, . . . , 220c, and a plurality of capacitor layers 224a and 224b. Although only three spacer layers are illustrated in FIG. 2, in various other embodiments, the interposer 30 can comprise any other appropriate number of spacer layers. In various other embodiments, the interposer 30 may not have any spacer layer. Although only three common layers and only two capacitor layers are illustrated in FIG. 2, in various other embodiments, the interposer 30 can comprise any other appropriate numbers of common layers and/or capacitor layers. In some of these embodiments, the interposer 30 comprises at least one common layer and at least one capacitor layer.

Figure 3:
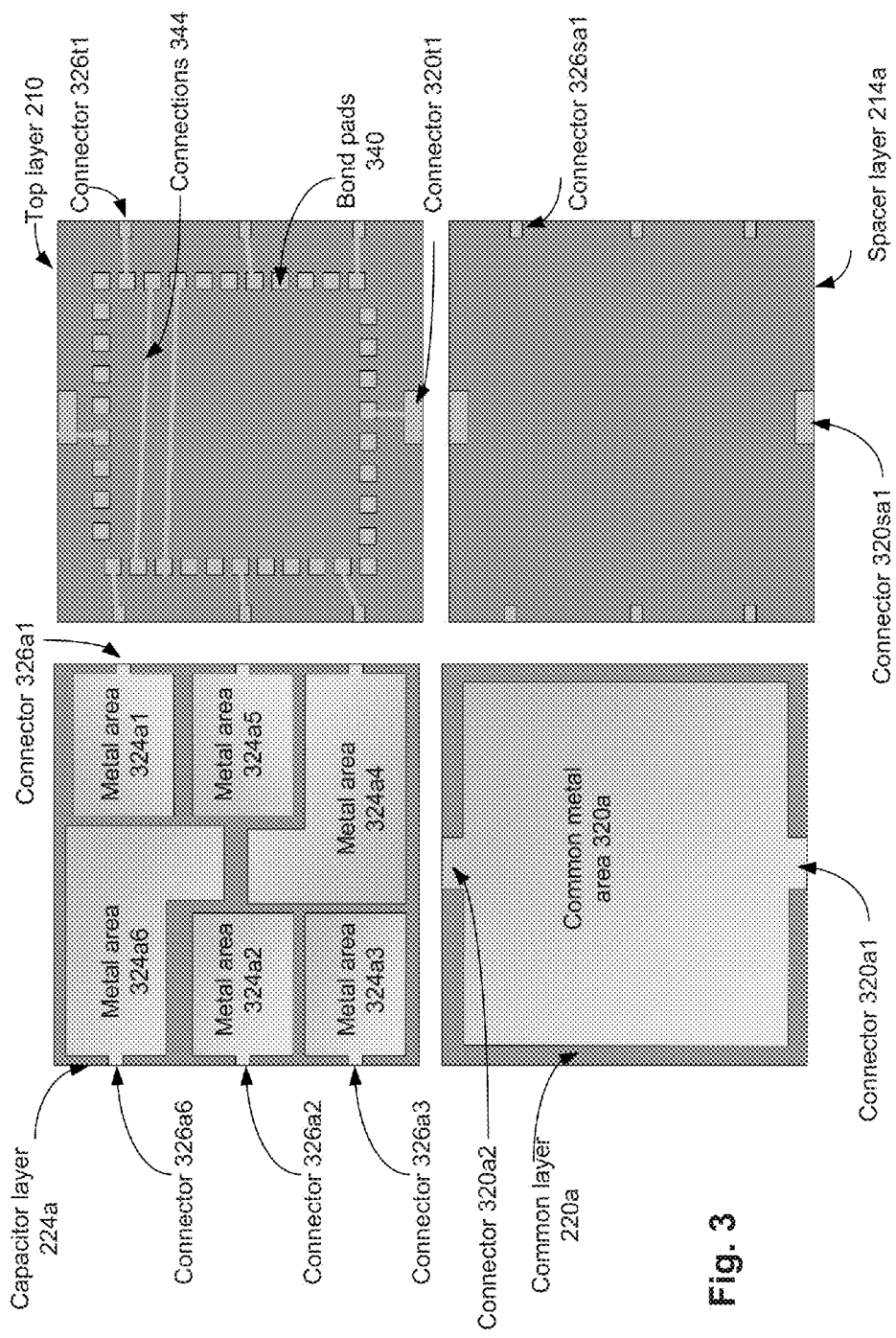
FIG. 3 schematically illustrates each type of the dielectric layers of the interposer of FIG. 2 in more detail, in accordance with an embodiment of the present disclosure.
Figure 4:
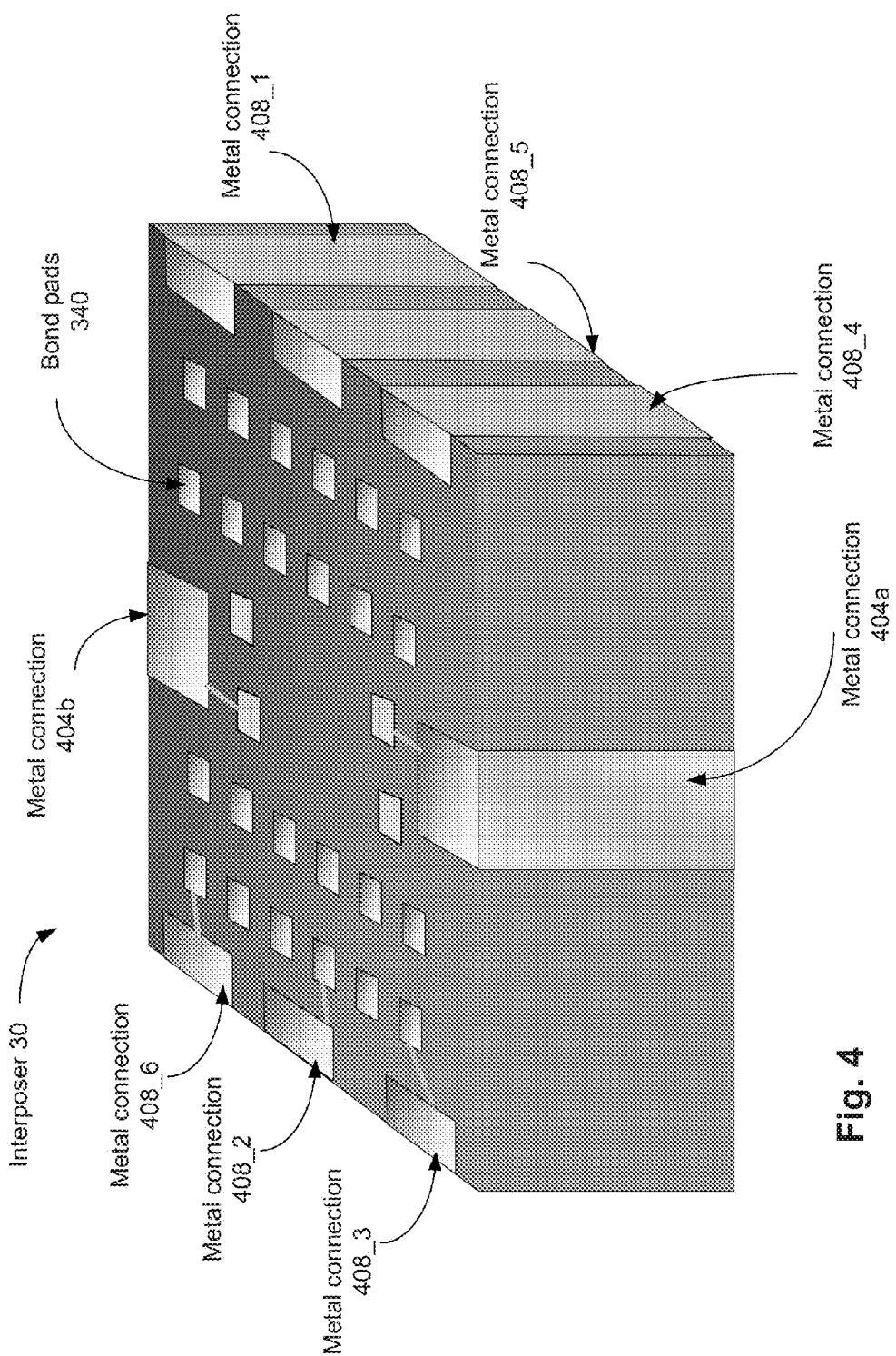
FIG. 4 schematically illustrates the interposer of FIGS. 2 and 3 with all the dielectric layers combined, in accordance with an embodiment of the present disclosure.

FIG. 3 schematically illustrates each type of the dielectric layers of the interposer 30 in more detail, in accordance with an embodiment of the present disclosure. For example, FIG. 3 illustrates the top layer 210, an example spacer layer 214a, an example common layer 220a, and an example capacitor layer 224a of the interposer 30 of FIG. 2 in more detail. It is to be noted that the relative arrangement of various dielectric layers of the interposer 30 in FIG. 3 (e.g., the top layer 210 being in the right side of the capacitor layer 224a) has no significance—various dielectric layers illustrated in FIG. 3 are arranged in a random fashion. Furthermore, FIG. 4 schematically illustrates the interposer 30 with all the dielectric layers combined, in accordance with an embodiment of the present disclosure.

Referring again to FIGS. 2 and 3, the top layer 210 forms a top most layer of the interposer 30. In various embodiments, the device 24 is disposed on a top surface of the top layer 210. The top surface of the top layer 210 has a plurality of bond pads 340 for connecting to the bond pads of the device 24, the bonding fingers 18 and/or the bond pads of the device 20. The top surface of the top layer 210 also includes metal connections (labeled as connections 344 in FIG. 3) to interconnect one or more bond pads 340.

As illustrated in FIG. 2, the common layers 220a, . . . , 220c and the capacitor layers 224a and 224b are arranged in an alternate manner (e.g., a capacitor layer on top of a common layer, and repeating this pattern). For example, the capacitor layers 224a and 224b and the common layers 220a, . . . , 220c are stacked in the interposer 30 such that individual capacitor layers are interleaved between two common layers. The spacer layers 214a, . . . , 214c of the interposer 30 separate the top layer 210 from the common layers and the capacitor layers.

In various embodiments, conductive material (e.g., a metal plate, also referred to herein as metal area) is disposed on top of each common layers 220a, . . . , 220c. For example, as illustrated in FIG. 3, a common metal area 320a is disposed on top of the common layer 220a. Similarly, although not illustrated in any of the figures, a common metal area 320b and a common metal area 320c (which are substantially similar in shape, size and/or conductive properties as the common metal area 320a) are disposed on top of the common layers 220b and 220c, respectively.

In each of the common metal areas, one or more connectors are formed. For example, connectors 320a1 and 320a2 are formed on the common metal area 320a. In various embodiments, the connector 320a1 is an extension of the common metal area 320a to an edge of the common layer 220a, as illustrated in FIG. 3. In various other embodiments, the connector 320a1 is provided through an appropriate metal connection between the common metal area 320a and the edge of the common layer 220a.

The connector 320a1 of the common metal area 320a has corresponding connectors in each of the other common metal areas, as illustrated in FIG. 2 (although the connectors are not labeled in FIG. 2 for purposes of illustrative clarity). In various embodiments, the connector 320a1 also has corresponding connectors in each of the spacer layers 214a, . . . , 214c and the top layer 210. For example, the spacer layer 214a has a connector 320sa1 and the top layer 210 has a connector 320t1, where the connector 320sa1 and the connector 320t1 correspond to the connector 320a1, as illustrated in FIG. 3. Similarly, the connector 320a2 of the common metal area 320a has corresponding connectors in each of the other common metal areas, in each of the spacer layers 214a, . . . , 214c and the top layer 210.

The connector 320a1 and the corresponding connectors in the other dielectric layers (i.e., in the other common metal areas, the spacer layers, and top layer 210) are substantially aligned, and the connector 320a2 and the corresponding connectors in the other dielectric layers are substantially aligned. For example, as illustrated in FIG. 2, the connector 320a1 and the corresponding connectors in the other dielectric layers are arranged such that these connectors are substantially aligned on top of each other in the interposer 30.

In various embodiments, once the various dielectric layers of the interposer are arranged, a metal strip connects the connector 320a1 and the corresponding connectors in the other dielectric layers, thereby forming a metal connection 404a, as illustrated in FIG. 4. The metal connection 404a has a connection point at the top surface of the interposer 30. In various embodiments, the connector 320t1 forms the connection point of the metal connection 404a at the top surface of the interposer 30. Thus, the metal connection 404a couples the plurality of common metal areas 320a, 320b and 320c, and provides the connection point at the top surface of the interposer 30.

Similarly, another metal strip connects the connector 320a2 and the corresponding connectors in the other dielectric layers, thereby forming a metal connection 404b, as illustrated in FIG. 4. Furthermore, the metal connection 404a has a corresponding connection point at the top surface of the interposer 30. In various embodiments, the metal connection 404a and the meat connection 404b are coupled (e.g., using connections disposed on the top surface of the top layer 210) to two respective bond pads of the interposer 30, as illustrated in FIGS. 2-4.

Referring again to FIGS. 2 and 3, one or more conductive layers (e.g., one or more metal plates, also referred to herein as metal areas) are disposed on top of each of the capacitor layers 224a and 220b. For example, as illustrated in FIG. 3, metal areas 324a1, . . . , 324a6 are disposed on top of the capacitor layer 224a. Similarly, although not illustrated in any of the figures, metal areas 324b1, . . . , 324b6 are disposed on top of the capacitor layer 224b. In various embodiments, metal areas 324a1 and 324b1 are substantially similar in shape, size and/or conductive properties; metal areas 324a2 and 324b2 are substantially similar in shape, size and/or conductive properties, and so on.

Furthermore, the metal areas 324a1 and 324b1 are arranged such that the metal areas 324a1 and 324b1 substantially aligned (e.g., on top of each other) when the various dielectric layers are assembled to form the interposer 30, as illustrated in FIG. 2. Similarly, the metal area 324a2 is substantially aligned with corresponding metal area 324b2, the metal area 324a3 is substantially aligned with corresponding metal area 324b3, and so on.

The shapes, sizes and number of the metal areas in each of the capacitor layers are based on, for example, a configuration and an application area of the structure 10. For example, FIG. 3 illustrates six metal areas in the capacitor layer 224a, which facilitates formation of six separate capacitors that are embedded within the interposer 30, as will be discussed in more detail herein later. Accordingly, the number of metal areas in each of the capacitor layers is based at least in part of a desired number of capacitors that are to be embedded within the interposer 30. Also, a capacitance of an embedded capacitor is associated with a shape and/or a size of corresponding metal areas. For example, by configuring a size of a metal area (and/or by appropriately shaping the metal area), the corresponding capacitance value can be controlled. The shapes, sizes and the number of metal areas in the capacitor layers in FIGS. 2 and 3 are examples only, and in no way limit the scope of the present disclosure.

For each of the metal areas in each of the capacitor layers, one or more connectors are formed. For example, as illustrated in FIG. 3, for the capacitor layer 224a, a connector 326a1 is formed for the metal area 324a1, a connector 326a2 is formed for the metal area 324a2, and so on. Similarly, although not illustrated in any of the figures, for the capacitor layer 224b, a connector 326b1 is formed for the metal area 324b1, a connector 326b2 is formed for the metal area 324b2, and so on.

In various embodiments, each connector of the various metal areas in the various capacitor layers is an extension of the corresponding metal area to an edge of the corresponding capacitor layer. For example, the connector 326a1 is an extension of the metal area 324a1 to an edge of the capacitor layer 224a. In various other embodiments, the connector 326a1 is provided through an appropriate metal connection between the metal area 324a1 and the edge of the capacitor layer 224a.

The connector 326a1 of the metal area 324a1 has corresponding connectors in the corresponding metal areas of the other capacitor layers. For example, although not specifically labeled in FIG. 2, the connector 326a1 of the metal area 324a1 has the corresponding connector 326b1 in the metal area 324b1. In various embodiments, the connector 324a1 also has corresponding connectors in each of the spacer layers 214a, . . . , 214c and the top layer 210. For example, the spacer layer 214a has a connector 326sa1 and the top layer 210 has a connector 326t1 corresponding to the connector 326a1 of the metal area 324a1, as illustrated in FIG. 3.

Similarly, the connectors in each of the other metal areas in the capacitor layer 224a (e.g., connector 326a2 of the metal area 324a2) have corresponding connectors in the corresponding metal areas of each of the other capacitor layers, in each of the spacer layers 214a, . . . , 214c and in the top layer 210.

A connector in a metal area of a capacitor layer (e.g., connector 326a1 of the metal area 324a1 of the capacitor layer 224a) and the corresponding connectors in the other dielectric layers (e.g., in the corresponding metal areas of the other capacitor layers, the spacer layers, and top layer 210) are substantially aligned. For example, as illustrated in FIG. 2, the connector 326a1 and the corresponding connector in the capacitor layer 224b (and the corresponding connectors in the spacer layers and the top layer 210) are arranged such that these connectors are substantially aligned on top of each other in the interposer 30.

In various embodiments, once the various dielectric layers of the interposer 30 are arranged, a metal strip connects the connector 326a1 and the corresponding connectors in the other dielectric layers, thereby forming a metal connection 408_1, as illustrated in FIG. 4. The metal connection 408_1 has a connection point at a top surface of the interposer 30 (e.g., the connector 326t1 forms the connection point at the top surface of the interposer 30). That is, the metal connection 408_1 couples the plurality of metal areas 324a1 and 324b1, and provides the connection point at the top surface of the interposer 30.

Similarly, another metal strip connects the connector 326a2 and the corresponding connectors in the other dielectric layers, thereby forming a metal connection 408_2, as illustrated in FIG. 4. In a similar manner, each of the other metal areas of the (e.g., metal areas 324a3, . . . , 324a6) of the capacitor layer 224a is coupled to corresponding metal areas using corresponding metal connections (e.g., metal connections 408_3, . . . , 408_6). In various embodiments, each of the metal connections 408_1, . . . , 408_6 is coupled to a corresponding bond pad of the interposer 30 (e.g., using connections disposed on the top surface of the top layer 210), as illustrated in FIGS. 2-4.

In various embodiments, a metal area (e.g., metal area 324a1) of a capacitor layer and the corresponding metal areas (e.g., metal area 324b1) in the other capacitor layers are interleaved with the common metal areas (e.g., common metal areas 320a, 320b and 320c), and each of these layers are parallel and are separated by a layer of dielectric material. Furthermore, the metal area of the capacitor layer and the corresponding metal areas in the other capacitor layers are electrically coupled by the corresponding metal connection (e.g., metal connection 408_1). Similarly, the common metal areas are also electrically coupled by the metal connections 404a and 404b. Accordingly, the metal area of the capacitor layer and the corresponding metal areas, in conjunction with the common metal areas, form a capacitor.

For example, metal areas 324a1 and 324b1, in conjunction with the common metal areas 320a, 320b and 320c, form a first capacitor that is embedded within the interposer 30, where the metal connections 404a and 404b form a first terminal of the first capacitor and the metal connection 408_1 forms a second terminal of the first capacitor.

Similarly, metal areas 324a2 and 324b2, in conjunction with the common metal areas 320a, 320b and 320c, form a second capacitor that is embedded within the interposer 30, where the metal connections 404a and 404b form a first terminal of the second capacitor and the metal connection 408_2 forms a second terminal of the second capacitor. In a similar manner, four more capacitors (e.g., corresponding to the metal areas 324a3, . . . , 324a6) are formed, which are embedded within the interposer 30.

The metal connection 404a (and also the metal connection 404b, which is coupled to the metal connection 404a through the common metal areas) is common to all the six capacitors that are embedded within the interposer 30. In some applications, the metal connections 404a and 404b are used as a common ground terminal for the six capacitors.

In various embodiments, the six embedded capacitors of the interposer can be used for various purposes. As an example, the first capacitor is coupled between a first power connection (e.g., with a voltage of VDD1) and a ground connection of the device 38, the second capacitor is coupled between a second power connection (e.g., with a voltage of VDD2) and the ground connection of the device 38, and so on. Coupling a capacitor between a power connection and a ground connection has several advantages, e.g., facilitates reduction in a power to ground induction, reduction of noise in the power to ground connection, and/or the like.

Although the interposer 30 has six embedded capacitors, a number of the capacitors embedded in the interposer 30 and the associated capacitance can be varied by configuring a number, shape and size of the metal areas in the capacitor layers, as previously discussed. For example, for a device that has three different power connections (e.g., with three different power supply voltages), the interposer 30 can have at least three embedded capacitors (e.g., each for the corresponding power connection).

Embedding the capacitors in the interposer 30 of the lead frame 14 of the semiconductor package structure 10 has several advantages compared to a conventional semiconductor package structure employing a conventional leadframe and a conventional interposer. For example, in a conventional semiconductor package structure, capacitors used to decouple the power and ground connections of a device are generally mounted of a PCB on which the lead frame is mounted. Such placement of the capacitors in the conventional semiconductor package structure results in a relatively large distance between the device and the capacitors, thereby decreasing an effectiveness of the capacitors, increasing an inductance between the power and ground connections, and increasing noise between the power and ground connections. In contrast, in accordance with an embodiment of the present disclosure, the embedded capacitors (e.g., embedded within the interposer 30) are located directly beneath the device 24, thereby significantly reducing the distance between the device 24 and the capacitors compared to the conventional semiconductor package structure.

Figure 5:
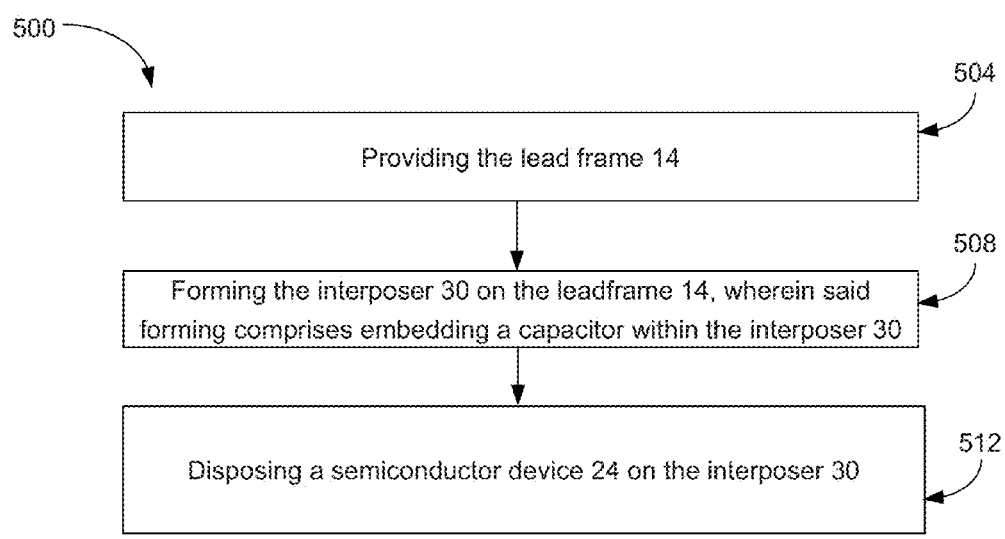
FIG. 5 illustrates an example method for forming the semiconductor package structure of FIG. 1, in accordance with an embodiment of the present disclosure.

FIG. 5 illustrates an example method 500 for forming the structure 10 of FIG. 1, in accordance with an embodiment of the present disclosure. At 504, the lead frame 14 is provided (e.g., within the structure 10, and disposed over, for example, an appropriate PCB). At 508, an interposer 30 is formed on the leadframe 14, where forming the interposer comprises embedding a capacitor within the interposer 30. As an example, in the interposer 30 of FIGS. 2-4, six capacitors are embedded in the interposer 30. In various embodiments, the embedded capacitor is formed using at least (i) a first conductive area (e.g., the metal area 324a1) disposed on a first dielectric layer (e.g., the capacitor layer 224a) and (ii) a second conductive area (e.g., the common metal area 320a) disposed on a second dielectric layer (e.g., the common layer 220a). At 512, a semiconductor device 24 is disposed on the interposer 30.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A semiconductor package structure comprising:
   a leadframe;
   an interposer disposed on the leadframe, the interposer comprising a plurality of dielectric layers including at least (i) a first dielectric layer and (ii) a second dielectric layer;
   a semiconductor device disposed on the interposer; and
   a capacitor that is embedded within the interposer, wherein the capacitor is formed using at least (i) a first conductive area disposed on the first dielectric layer and (ii) a second conductive area disposed on the second dielectric layer.

2. The semiconductor package structure of claim 1, wherein:
   the plurality of dielectric layers of the interposer includes a plurality of capacitor layers and a plurality of common layers, the plurality of capacitor layers include the first dielectric layer, and the plurality of common layers include the second dielectric layer;
   the capacitor further comprises a plurality of metal areas including the first conductive area, where each of the plurality of metal areas is disposed on a corresponding capacitor layer of the plurality of capacitor layers; and
   the capacitor further comprises a plurality of common metal areas including the second conductive area, where each of the plurality of common metal areas is disposed on a corresponding common layer of the plurality of common layers.

3. The semiconductor package structure of claim 1, wherein the capacitor is coupled between a power connection and a ground connection of the semiconductor device.

4. The semiconductor package structure of claim 1, wherein the capacitor is a first capacitor, the semiconductor package structure further comprising:
   a second capacitor that is embedded within the interposer, wherein the second capacitor is formed using at least (i) a third conductive area disposed on the first dielectric layer, and (ii) the second conductive area.

5. The semiconductor package structure of claim 1, wherein the interposer further comprises a top layer and a plurality of spacer layers, wherein the spacer layer separates the top layer from the first dielectric layer and the second dielectric layer.

6. The semiconductor package structure of claim 2, wherein the capacitor further comprises:
   a first plurality of connectors, wherein each of the first plurality of connectors is disposed on a corresponding metal area of the plurality of metal areas; and a second plurality of connectors, wherein each of the second plurality of connectors is disposed on a corresponding common metal area of the plurality of common metal areas.

7. The semiconductor package structure of claim 2, wherein:
each of the plurality of metal areas are substantially similar in shape, size and conductance properties; and
each of the plurality of common metal areas are substantially similar in shape, size and conductance properties.

8. The semiconductor package structure of claim 2, wherein the plurality of capacitor layers and the plurality of common layers are stacked such that individual capacitor layers of the plurality of capacitor layers are interleaved between two common layers of the plurality of common layers.

9. The method of claim 5, further comprising:
coupling a power connection and a ground connection of the semiconductor device to the capacitor.

10. The method of claim 5, wherein the capacitor is a first capacitor, and wherein forming the interposer further comprises:
embedding a second capacitor within the interposer using at least (i) a third conductive area disposed on the first dielectric layer and (ii) the second conductive area.

11. The semiconductor package structure of claim 6, wherein the capacitor further comprises:
a first metal connection that couples the first plurality of connectors; and
a second metal connection that couples the second plurality of connectors, wherein the first metal connection and the second metal connection form two connection terminals of the capacitor.

12. The semiconductor package structure of claim 11, wherein:
the first metal connection is coupled to a first bond pad and the second metal connection is coupled to a second bond pad of the interposer.

13. A method comprising:
providing a lead frame;
forming an interposer on the leadframe, wherein the interposer comprises a plurality of dielectric layers including at least (i) a first dielectric layer and a (ii) second dielectric layer; and
disposing a semiconductor device on the interposer,
wherein forming the interposer further comprises
embedding a capacitor within the interposer using at least (i) a first conductive area disposed on the first dielectric layer and (ii) a second conductive area disposed on the second dielectric layer.

14. The method of claim 13, wherein:
the plurality of dielectric layers of the interposer includes a plurality of capacitor layers and a plurality of common layers;
the plurality of capacitor layers and the plurality of common layers include the first dielectric layer and the second dielectric layer, respectively;
the capacitor comprises (i) a plurality of metal areas including the first conductive area and (ii) a plurality of common metal areas including the second conductive area; and
embedding the capacitor further comprises
disposing each of the plurality of metal areas on a corresponding capacitor layer of the plurality of capacitor layers, and
disposing each of the plurality of common metal areas on a corresponding common layer of the plurality of common layers.

15. The method of claim 14, wherein embedding the capacitor further comprises:
disposing a first plurality of connectors such that each of the first plurality of connectors is disposed on a corresponding metal area of the plurality of metal areas; and
disposing a second plurality of connectors such that each of the second plurality of connectors is disposed on a corresponding common metal area of the plurality of common metal areas.

16. The method of claim 14, wherein:
each of the plurality of metal areas are substantially similar in shape, size and conductance properties; and
each of the plurality of common metal areas are substantially similar in shape, size and conductance properties.

17. The method structure of claim 14, wherein individual capacitor layers of the plurality of capacitor layers are interleaved between two common layers of the plurality of common layers.

18. The method of claim 15, wherein embedding the capacitor further comprises:
forming a first metal connection that couples the first plurality of connectors; and
forming a second metal connection that couples the second plurality of connectors, wherein the first metal connection and the second metal connection form two connection terminals of the capacitor.

* * * * *